(12) United States Patent
Walke et al.

(10) Patent No.: US 11,557,503 B2
(45) Date of Patent: Jan. 17, 2023

(54) METHOD FOR CO-INTEGRATION OF III-V DEVICES WITH GROUP IV DEVICES

(71) Applicant: IMEC VZW, Leuven (BE)

(72) Inventors: Amey Mahadev Walke, Heverlee (BE); Liesbeth Witters, Lubbeek (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 16/996,413

(22) Filed: Aug. 18, 2020

(65) Prior Publication Data
US 2021/0118724 A1    Apr. 22, 2021

(30) Foreign Application Priority Data

Oct. 16, 2019   (EP) .................................. 19203579.8

(51) Int. Cl.
*H01L 21/76*       (2006.01)
*H01L 21/762*      (2006.01)
(Continued)

(52) U.S. Cl.
CPC .. *H01L 21/76224* (2013.01); *H01L 21/02381* (2013.01); *H01L 21/8249* (2013.01); *H01L 27/0705* (2013.01)

(58) Field of Classification Search
CPC ......... H01L 21/76224; H01L 21/02381; H01L 21/8249; H01L 27/0705; H01L 21/02455;
(Continued)

(56) References Cited

U.S. PATENT DOCUMENTS 8,324,660 B2    12/2012 Lochtefeld et al.
8,487,316 B2    7/2013  Cheng et al.
(Continued)

FOREIGN PATENT DOCUMENTS

EP    2849219 A1    3/2015
EP    19195256.3    9/2019
(Continued)

OTHER PUBLICATIONS

Collaert, N., et al., "Fabrication Challenges and Opportunities for High-Mobility Materials: from CMOS Applications to Emerging Derivatives Technology", Advanced Etch Technology for Nanopatterning VIII, 2019, Proc. of SPIE, vol. 10963, pp. 1096305-1 to 1096305-9.
(Continued)

*Primary Examiner* — Shouxiang Hu
(74) *Attorney, Agent, or Firm* — McDonnell Boehnen Hulbert & Berghoff LLP

(57) ABSTRACT

The present disclosure relates to a semi-conductor structure and method for co-integrating a III-V device with a group IV device on a $Si_xGe_{1-x}(100)$ substrate. The method includes: (a) providing a $Si_xGe_{1-x}(100)$ substrate, where x is from 0 to 1; (b) selecting a first region for forming therein a group IV device and a second region for forming therein a III-V device, the first and the second region each comprising a section of the $Si_xGe_{1-x}(100)$ substrate; (c) forming a trench isolation for at least the III-V device; (d) providing a $Si_yGe_{1-y}(100)$ surface in the first region, where y is from 0 to 1; (e) at least partially forming the group IV device on the $Si_yGe_{1-y}(100)$ surface in the first region; (f) forming a trench in the second region which exposes the $Si_xGe_{1-x}(100)$ substrate, the trench having a depth of at least 200 nm, at least 500 nm, at least 1 µm, usually at least 2 µm, such as 4 µm, with respect to the $Si_yGe_{1-y}(100)$ surface in the first region; (g) growing a III-V material in the trench using aspect ratio trapping; and (h) forming the III-V device on the III-V material, the III-V device comprising at least one contact region at a height within 100 nm, 50 nm, 20 nm, usually 10 nm, of a contact region of the group IV device.

17 Claims, 8 Drawing Sheets

(51) Int. Cl.
    *H01L 21/02* (2006.01)
    *H01L 21/8249* (2006.01)
    *H01L 27/07* (2006.01)

(58) Field of Classification Search
    CPC ......... H01L 21/02538; H01L 21/02639; H01L 29/66318; H01L 27/0605; H01L 27/0623; H01L 29/7371; H01L 21/8258
    See application file for complete search history.

(56) References Cited

U.S. PATENT DOCUMENTS

| | | | |
|---|---|---|---|
| 8,759,169 | B2 | 6/2014 | Kittler et al. |
| 8,835,988 | B2 | 9/2014 | Marino et al. |
| 8,987,141 | B2 | 3/2015 | Zhou et al. |
| 9,330,908 | B2 * | 5/2016 | Adam ............... H01L 21/02538 |
| 9,431,243 | B2 | 8/2016 | Lochtefeld et al. |
| 9,508,640 | B2 | 11/2016 | Cheng et al. |
| 9,570,403 | B2 | 2/2017 | Cao et al. |
| 9,660,069 | B2 | 5/2017 | Bayram et al. |
| 10,431,581 | B1 | 10/2019 | Li et al. |
| 11,195,767 | B2 | 12/2021 | Walke et al. |
| 2008/0070355 | A1 | 3/2008 | Lochtefeld et al. |
| 2008/0169474 | A1 | 7/2008 | Sheppard |
| 2010/0213512 | A1 | 8/2010 | Ko |
| 2012/0305992 | A1 | 12/2012 | Marino et al. |
| 2013/0271208 | A1 | 10/2013 | Then et al. |
| 2016/0365416 | A1 * | 12/2016 | Metz ............... H01L 21/823431 |
| 2017/0229480 | A1 | 8/2017 | Jin et al. |
| 2018/0130801 | A1 | 5/2018 | Rachmady et al. |
| 2019/0006171 | A1 | 1/2019 | Dasgupta et al. |
| 2019/0051562 | A1 | 2/2019 | Radosavljevic et al. |

FOREIGN PATENT DOCUMENTS

| | | |
|---|---|---|
| EP | 3624179 A1 | 3/2020 |
| WO | 2017/039587 A1 | 3/2017 |
| WO | 2017/171829 A1 | 10/2017 |
| WO | 2017218015 A1 | 12/2017 |
| WO | 2017222513 A1 | 12/2017 |
| WO | 2018/007711 A1 | 1/2018 |

OTHER PUBLICATIONS

Kunert, B., et al., "III/V Nano Ridge Structures for Optical Applications on Patterned 300 mm Silicon Substrate", Appl. Phys. Lett., Aug. 29, 2016, vol. 109, 091101, pp. 091101-1 to 091101-5.

Kunert, B., et al., "Gaining an Edge with Nano-Ridges", Compound Semiconductor, Jul. 2018, vol. 24, Issue 05, pp. 34-41.

Extended European Search Report from the European Patent Office, for European Application No. 19203579.8, dated Mar. 26, 2020, pp. 1-10.

European Search Report, European Patent Application No. 18194368.9, dated Feb. 22, 2019, 8 pages.

Bin Lu, Jin Wook Chung et al., "On-Wafer Seamless Integration of GaN and Si (100) Electronics", 2009 Annual IEEE Compound Semiconductor Integrated Circuit Symposium, 2009, pp. 1-4.

Shichijo, Hisashi et al., "Co-Integration of GaAs MESFET and Si CMOS Circuits", IEEE Electron Device Letters, vol. 9, No. 9, Sep. 1988, pp. 444-446.

Kazior, Thomas E., "Beyond CMOS: Heterogeneous Integration of III-V Devices, RF MEMS and Other Dissimilar Materials/Devices With Si CMOS to Create Intelligent Microsystems", Philosophical Transactions of The Royal Society A, 372, 2014, pp. 1-15.

Lee, Ko-Tao et al., "GaN Devices on a 200 mm Si Platform Targeting Heterogeneous Integration", IEEE Electron Device Letters, vol. 38, No. 8, Aug. 2017, pp. 1094-1096.

* cited by examiner

METHOD FOR CO-INTEGRATION OF III-V DEVICES WITH GROUP IV DEVICES

CROSS-REFERENCE

This application claims priority from European Patent Application No. 19203579.8, filed Oct. 16, 2019, which is incorporated by reference in its entirety.

FIELD OF THE DISCLOSURE

The present disclosure relates to co-integration of III-V devices with group IV devices and more in particular to such integration on $Si_xGe_{1-x}$(100) substrate.

BACKGROUND OF THE DISCLOSURE

III-V materials (e.g. GaAs, InGaAs or InP) can typically exhibit a higher electron mobility and saturation velocity compared to group IV materials (e.g. Si or Ge). They are therefore widely used in radio-frequency (RF) applications such as mobile communications, radar and satellite communication. III-V devices can also deliver more power at a high frequency (e.g. above 1 GHz) compared to group IV devices. As such, heterojunction bipolar transistors (HBT) made with III-V materials—for example—can be especially used for very high frequency (e.g. GHz to THz range) applications, where Si devices cannot be used effectively.

Most of the mm-wave RF circuits used today are usually made on III-V substrates (e.g. GaAs or InP substrate) which can be typically smaller in size (e.g. up to 6 inches) and very expensive. Conversely, group IV devices, such as group IV complementary metal-oxide-semiconductor (CMOS) devices, can be made on large substrates (e.g. 200 mm to 300 mm) and can be exceedingly useful to build very large scale integrated circuits. The combination of III-V devices with group IV devices on the same substrate can thus open several interesting applications and possibilities. For example, co-integration of III-V HBT power amplifiers with group IV CMOS envelope tracking can be attractive for mobile communications (3G, 4G or 5G), where the HBT power amplifier can be combined with CMOS base-band signal processing. different approaches for integrating both III-N transistors and Si-based transistors. In one approach, the method comprises, starting from a silicon-on-insulator (SOI) substrate, epitaxially growing a III-N semiconductor stack over a (111) silicon layer within a first region of the substrate, epitaxially growing raised (100) silicon from a (100) silicon substrate layer within a second region of the substrate, forming a plurality of III-N transistors within the first substrate region, forming a plurality of Si transistors within the second substrate region, and interconnecting the different transistors. However, such a starting substrate comprising both the (111) silicon layer and (100) silicon substrate layer is not widely available and its fabrication can be involved and expensive. Moreover, III-V materials and devices can be typically more temperature sensitive than group IV devices, so that forming the group IV devices after the III-V devices can either add additional constraints thereto or lead to deterioration of the III-V devices.

Thus, there is still a need in the art for better ways of integrating III-V devices with group IV devices on a single substrate.

SUMMARY OF THE DISCLOSURE

It is an object of the present disclosure to provide good methods for co-integrating a III-V device with a group IV device on $Si_xGe_{1-x}$(100) substrate. It is a further object of the present disclosure to provide good structures associated therewith. These objectives can be accomplished by methods and semiconductor structures according to the present disclosure.

In embodiments of the present disclosure, a III-V device and a group IV device can be well-integrated on the same substrate. In embodiments of the present disclosure, different kinds of III-V and group IV devices can be integrated.

In embodiments of the present disclosure, the substrate can be a relatively cheap and widely available substrate, such as a Si(100) wafer.

In embodiments of the present disclosure, a difference in vertical space needed for the III-V device—as compared to the group IV device—can be compensated for. In embodiments of the present disclosure, a height offset therefor can be realized in multiple ways.

In embodiments of the present disclosure, the III-V device and group IV device can be integrated such that contact regions in the III-V device and group IV device can be situated at about the same height level. In embodiments of the present disclosure, metallization (e.g. forming of metal contacts interconnects to the contact regions) can thereby be facilitated.

In embodiments of the present disclosure, the thermal sensitivity of the different materials and structures used can be respected, in that steps can be ordered such that those requiring or benefitting from a higher temperature can be performed before those that introduce more temperature-sensitive materials or structures.

In embodiments of the present disclosure, at least an active layer of—the III-V material can comprise a low level of growth defects; for example through the use of aspect ratio trapping and—optionally—a V-shaped abutment defined by (111)-oriented surfaces of the substrate. In embodiments of the present disclosure, the III-V material can be provided in a beneficial form therefor, e.g. as a nano-ridge.

In embodiments of the present disclosure, different surfaces can be realized on or from the substrate, e.g. surfaces which are better suited for forming group IV devices thereon on the one hand and surfaces which are better suited for forming III-V devices thereon on the other hand.

In embodiments of the present disclosure, a passivation around the III-V material can be improved.

The embodiments of the present disclosure can be performed in a relatively straightforward and economical fashion.

In a first aspect, the present disclosure relates to a method comprising: (a) providing a $Si_xGe_{1-x}$(100) substrate, where x is from 0 to 1; (b) selecting a first region for forming therein a group IV device and a second region for forming therein a III-V device, the first and the second region each comprising a section of the $Si_xGe_{1-x}$(100) substrate; (c) forming a trench isolation for at least the III-V device; (d) providing a $Si_yGe_{1-y}$(100) surface in the first region, where y is from 0 to 1; (e) at least partially forming the group IV device on the $Si_yGe_{1-y}$(100) surface in the first region; (f) forming a trench in the second region which exposes the $Si_xGe_{1-x}$(100) substrate, the trench having a depth of at least 200 nm, preferably at least 500 nm, yet more preferably at least 1 µm, most preferably at least 2 µm, such as 4 µm, with respect to the $Si_yGe_{1-y}$(100) surface in the first region; (g) growing a III-V material in the trench using aspect ratio trapping; and (h) forming the III-V device on the III-V material, the III-V device comprising at least one contact region at a height within 100 nm, preferably 50 nm, yet more preferably 20 nm, most preferably 10 nm, of a contact region of the group IV device.

In a second aspect, the present disclosure relates to a semiconductor structure comprising: (i) a $Si_xGe_{1-x}(100)$ substrate, where x is from 0 to 1; (ii) a trench isolation on the $Si_xGe_{1-x}(100)$ substrate; (iii) a first region comprising a first section of the $Si_xGe_{1-x}(100)$ substrate, and an at least partially formed group IV device on a $Si_yGe_{1-y}(100)$ surface, where y is from 0 to 1; and (iv) a second region comprising a second section of the $Si_xGe_{1-x}(100)$ substrate, a trench which exposes the $Si_xGe_{1-x}(100)$ substrate and filled with a III-V material, the trench having a depth of at least 200 nm, preferably at least 500 nm, yet more preferably at least 1 μm, most preferably at least 2 μm, with respect to the $Si_yGe_{1-y}(100)$ surface in the first region, and a III-V device on the III-V material, the III-V device comprising at least one contact region at a height within 100 nm, preferably 50 nm, yet more preferably 20 nm, most preferably 10 nm, of a contact region of the group IV device.

Particular and preferred aspects of the disclosure are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics and features of the present disclosure will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

Figure 1:
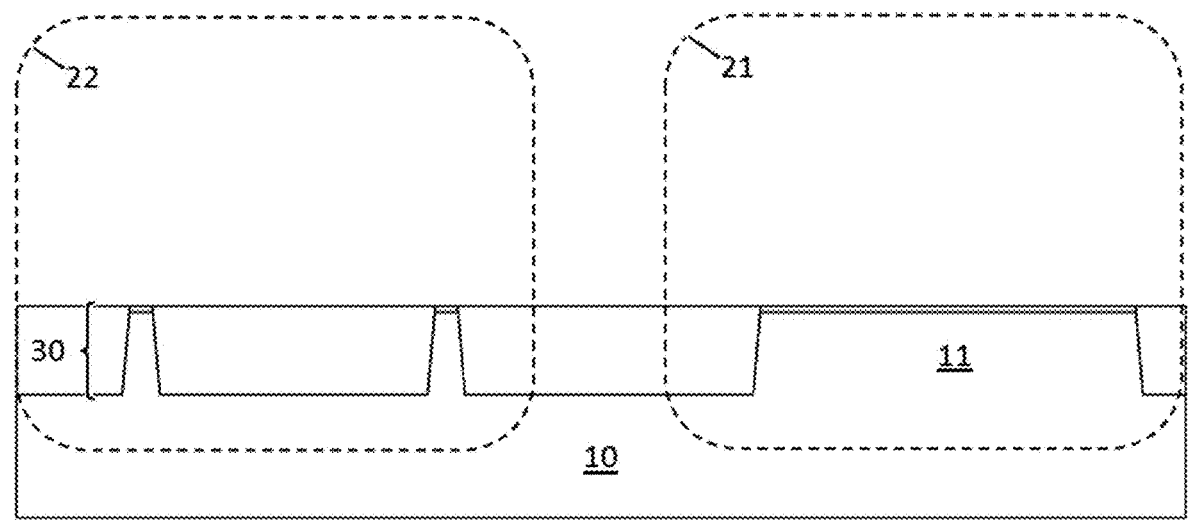
FIG. 1 schematically depicts a semiconductor structure at different stages of a method in accordance with a first exemplary embodiment of the present disclosure. A Si(100) wafer (10) can be provided, and a first region (21) and second region (22)—each comprising a section of the Si substrate (10)—may be selected for forming therein respectively a group IV device (50) and a III-V device (80). A shallow trench isolation (30) for the III-V device (80) may then formed with a $SiO_2$ dielectric.

In the different figures, the same reference signs refer to the same or analogous elements.

DETAILED DESCRIPTION OF THE DISCLOSURE

The present disclosure will be described with respect to particular embodiments and with reference to certain drawings, but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, bottom, over, under, upper, lower and the like in the description and the claims are used for descriptive purposes and not necessarily for describing relative positions. It is to be understood that the terms so used are interchangeable with their antonyms under appropriate circumstances and that the embodiments of the disclosure described herein are capable of operation in other orientations than described or illustrated herein.

The term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. The term "comprising" therefore covers the situation where only the stated features are present and the situation where these features and one or more other features are present. Thus, the scope of the expression "a device comprising means A and B" should not be interpreted as being limited to devices consisting only of components A and B. It means that with respect to the present disclosure, the only relevant components of the device are A and B.

Similarly, the term "coupled" should not be interpreted as being restricted to direct connections only. The terms "coupled" and "connected", along with their derivatives, may be used. It should be understood that these terms are not intended as synonyms for each other. Thus, the scope of the expression "a device A coupled to a device B" should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various disclosed aspects. This method of disclosure, however, is not to be interpreted as reflecting an intention that the claimed disclosure requires more features than are expressly recited in each claim. Rather, as the following claims reflect, disclosed aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments of the disclosure may be practised without these specific details. In other instances, well-known methods, structures and techniques have not been shown in detail in order not to obscure an understanding of this description.

Reference will be made to transistors. These are devices having a first main electrode such as a drain or emitter, a second main electrode such as a source or collector and a control electrode such as a gate or base for controlling the flow of electrical charges between the first and second main electrodes.

The following terms are provided solely to aid in the understanding of the disclosure.

As used herein, and unless otherwise specified, a III-V device can be a device comprising a III-V material (e.g. GaAs, InGaAs or InP) as an active material. Likewise, a group IV device can be a device comprising a group IV material (e.g. Si, Ge or SiGe) as an active material. In particular embodiments, the group IV device may comprise a group IV and a III-V active material. For example, a group IV complementary metal-oxide-semiconductor device (CMOS) could comprise a Ge p-channel metal-oxide-semiconductor field-effect transistor (p-channel MOSFET or PMOS) and a III-V n-channel MOSFET (NMOS).

In a first aspect, the present disclosure relates to a method comprising: (a) providing a $Si_xGe_{1-x}$(100) substrate, where x is from 0 to 1; (b) selecting a first region for forming therein a group IV device and a second region for forming therein a III-V device, the first and the second region each comprising a section of the $Si_xGe_{1-x}$(100) substrate; (c) forming a trench isolation for at least the III-V device; (d) providing a $Si_yGe_{1-y}$(100) surface in the first region, where y is from 0 to 1; (e) at least partially forming the group IV device on the $Si_yGe_{1-y}$(100) surface in the first region; (f) forming a trench in the second region which exposes the $Si_xGe_{1-x}$(100) substrate, the trench having a depth of at least 200 nm, at least 500 nm, at least 1 µm, and at least 2 µm, such as 4 µm, with respect to the $Si_yGe_{1-y}$(100) surface in the first region; (g) growing a III-V material in the trench using aspect ratio trapping; and (h) forming the III-V device on the III-V material, the III-V device comprising at least one contact region at a height within 100 nm, 50 nm, 20 nm, or 10 nm, of a contact region of the group IV device.

In embodiments, the $Si_xGe_{1-x}$(100) substrate may be a Si(100) substrate (i.e. x may be 1), Ge substrate (i.e. x may be 0) or a mixture thereof (i.e. x may be between 0 and 1);

usually a Si(100) substrate. In embodiments, the $Si_yGe_{1-y}$(100) surface may be Si(100) surface (i.e. y may be 1), Ge surface (i.e. y may be 0) or a mixture thereof (i.e. y may be between 0 and 1); usually a Si(100) surface. Si(100) substrates and surfaces—compared to SiGe or Ge substrates and surfaces—can be typically more easily and/or cheaply provided (such acquired, e.g. as Si(100) wafers, or produced, e.g. grown on top of a substrate) and otherwise worked with (e.g. processed); hence they can often be the usual substrates and/or surfaces within the present disclosure.

In embodiments, the III-V device may be a vertical or a planar device; usually vertical. Indeed, the present disclosure can be beneficial to both vertical and planar III-V devices, but the problem of the height difference (cf. infra) can be typically larger for vertical than for planar devices. In embodiments, the III-V device may be a heterojunction bipolar transistor (HBT) or a high-electron-mobility transistor (HEMT), usually HBT. In embodiments, the group IV device may be a complementary metal-oxide-semiconductor device (CMOS). In embodiments, the CMOS device may be a fin field-effect transistor (FinFET).

Selecting a first and second region in step b typically involves choosing locations where the group IV and the III-V device are to be made. These regions are not necessarily delimited by physically distinguishable boundaries, but they each include a—typically different—section of the $Si_xGe_{1-x}$(100) substrate and a region above said substrate encompassing one of the aforementioned locations; thereby each forming a 3D space in which the respective devices will be made. The first and second region may typically be selected in such a way that they do not overlap and are located next to (e.g. adjacent to) one another—at the same height with respect to the substrate.

In embodiments, the trench isolation may be a shallow trench isolation (e.g. with a depth up to 1 µm) and/or a deep trench isolation (e.g. with a depth of from 1 µm to 4 µm). The depth may for example be measured as a height difference between a bottom (e.g. lowest surface) and a top (e.g. highest surface) of the trench isolation. In order to achieve good aspect ratio trapping in step g, it can be typically beneficial to have a depth which is at least two times the size (e.g. width or length) of the active area of the III-V material in the final III-V device. For a typical active area size of from 20 to 200 nm, this translates to a minimum depth of from 40 to 400 nm. The larger the ratio between the trench isolation depth and active area size, the more defects can typically be trapped in step g. Optionally, step c may further comprise forming a trench isolation for the group IV device. Such a trench isolation could however also be provided at a later stage (e.g. as part of step d or e).

In order to achieve a good co-integration of the III-V device and the group IV device, it can be beneficial to match (e.g. within 100 nm, 50 nm, 20 nm, or 10 nm from one another) the top level—such as the contact region(s)—of the III-V and group IV devices. However, III-V devices—be they planar or vertical—typically need considerably more vertical space (e.g. 500 nm to 2 µm) to be formed than group IV devices. For example, they may typically require a buffer layer (e.g. for reducing therein the number of growth defects), below the actual III-V active layer(s). This buffer layer may typically already require a thickness of several tens or hundreds of nanometres (e.g. before the number of growth defects is reduced to a desired level). Such a buffer layer may typically be unnecessary—or at least a same thickness thereof is not required—for group IV devices, since the group IV active layer can be part of the $Si_xGe_{1-x}$(100) substrate as such or can be grown directly thereon with minimal growth defects. In order to overcome this difference in vertical space then, the present disclosure realizes a height offset between the III-V and group IV device; i.e. a height difference between the starting level for III-V material growth on the one hand and the $Si_yGe_{1-y}$(100) surface on the other hand.

In embodiments, the trench isolation formed in step c may have a bottom and step d may comprise providing the $Si_yGe_{1-y}$(100) surface in the first region at a height of at least 200 nm, at least 500 nm, at least 1 µm, or at least 2 µm, such as 4 µm, above the trench isolation bottom.

In embodiments, step d may comprise depositing a dielectric layer (e.g. $SiO_2$) over the $Si_xGe_{1-x}$(100) substrate. In embodiments, the dielectric layer may have a thickness of at least 100 nm, at least 200 nm, at least 500 nm, or at least 1 µm, such as 2 µm or 4 µm. The dielectric layer may be typically used in combination with embodiments of the first or second type, cf. infra. Where used, the dielectric layer advantageously allows to overcome the vertical distance between the top of the trench isolation and the level where the $Si_yGe_{1-y}$(100) surface is to be realized. Furthermore, it plays a role in achieving a degree of planarization between the first and second regions.

Providing the $Si_yGe_{1-y}$(100) surface with the desired height offset can be achieved in multiple ways. In a first type of embodiments, step d may comprise exposing the $Si_xGe_{1-x}$(100) substrate in the first region and growing (e.g. regrowing) $Si_yGe_{1-y}$ thereon to form the $Si_yGe_{1-y}$(100) surface. In embodiments, the $Si_yGe_{1-y}$ may be lattice matched to $Si_xGe_{1-x}$(100) substrate. In embodiments, the part of the $Si_xGe_{1-x}$(100) substrate which is exposed may be a $Si_xGe_{1-x}$(100) base for growing $Si_yGe_{1-y}$ thereon. In embodiments, the $Si_xGe_{1-x}$(100) base may have been defined while forming the trench isolation in step c.

In a second type of embodiments, step d may comprise transferring a $Si_yGe_{1-y}$ layer comprising the $Si_yGe_{1-y}$(100) surface onto the $Si_xGe_{1-x}$(100) substrate. In embodiments, the Si layer may be transferred onto the dielectric layer.

Embodiments of the first or second type thus advantageously allow to realize the $Si_yGe_{1-y}$(100) surface at a certain height above the top of the trench isolation (i.e. the top of the $Si_xGe_{1-x}$(100) substrate).

In a third type embodiments, the trench isolation provided in step c may be a deep trench isolation (cf. supra) and the $Si_xGe_{1-x}$(100) substrate as provided in step a may comprise the $Si_yGe_{1-y}$(100) surface of step d. Rather than providing the $Si_yGe_{1-y}$(100) surface at a certain height above the top of the trench isolation, embodiments of the third type realize the desired height offset by lowering the level from which the III-V material will be grown.

Since a deep trench isolation can be typically more difficult to form than a shallow trench isolation, the trench isolation used in embodiments of the first or second type may be typically shallow. Nevertheless, it will be clear that—in embodiments—the different approaches can be combined, e.g. by achieving a first part of the desired height offset through a deeper trench isolation and achieving the rest of the height offset as described for the first or second type of embodiments.

At least partially forming the group IV device in step e may comprise performing at least those steps of the group IV device formation where a desired temperature to be used exceeds the thermal budget of the group III-V material. In embodiments, step e may comprise forming functional gates or forming dummy gates for the group IV device. In a gate-first process flow, the functional gates may typically be formed already during step e. Conversely, in a gate-last process flow, dummy gates may be formed during step e and may be replaced in a replacement metal gate (RMG) module after step g (e.g. before, during or after step h). In embodiments, step e may further comprise forming a protective layer (e.g. a zeroth-level dielectric, ILD0) over the at least partially formed group IV device.

In embodiments, forming the trench in the second region in step f may comprise etching opening through the dielectric layer—if present—and through the trench isolation, down to the $Si_xGe_{1-x}$(100) substrate. In embodiments, forming the trench may further comprise etching partially into the $Si_xGe_{1-x}$(100) substrate. Note that the trench in the second region may be distinct from the trench isolation formed in step c.

In embodiments, the trench formed in step f may comprise: a lower trench portion having a first trench width, and an upper trench portion having a second trench width. In embodiments, the first trench width may be from 0.05 to 0.75 times, usually from 0.1 to 0.5 times, the second trench width. The trench may thus be shaped such as to allow formation of a nano-ridge therein (cf. infra). In embodiments, the lower trench portion may be suitable for aspect ratio trapping of the III-V material, while the upper trench portion may be suitable for growth confinement of the III-V material. As described previously in the context of the trench isolation, a minimum depth of from 40 to 400 nm may be typically needed to achieve good aspect ratio trapping. As such, the bottom trench portion may have a trench depth of at least 40 nm, at least 100 nm, at least 200 nm, or at least 400 nm. In embodiments, a bottom of the trench (e.g. of the lower portion) and the bottom of the trench isolation may be at a comparable height (e.g. within 5 to 50 nm from one another, such as within 5 to 20 nm or 5 to 10 nm). Usually, the bottom of the trench may substantially align with or be above the bottom of the trench isolation. When the trench has a V-shaped abutment (cf. infra), at least the ends of the V may align with or be above the bottom of the trench isolation; the point of the V may optionally be above, aligned with or below the bottom of the trench isolation.

The trench typically has a depth such that a bottom thereof may be at the same height as, or somewhat higher (e.g. between 5 and 50 nm) than, the bottom of the shallow trench isolation for the III-V device.

In embodiments, the trench formed in step f may have a V-shaped abutment defined by (111)-oriented surfaces of the $Si_xGe_{1-x}$(100) substrate. In embodiments, the lower trench portion may be in contact with the V-shaped abutment. In embodiments, the V-shaped abutment may have an internal angle of about 70.6°. Usually, the V-shape may be oriented with point of the V facing 'downwards' (i.e. towards the $Si_xGe_{1-x}$(100) substrate) and the ends of the V facing 'upwards' (i.e. away from the $Si_xGe_{1-x}$(100) substrate); i.e. oriented as a 'V' rather than a ' 'Λ' '. The (111)-oriented surfaces advantageously facilitate III-V material growth thereon with less defects, thereby allowing to achieve—after ART—a sufficiently defect-free III-V material already within a smaller growth thickness (as compared to growing the III-V material—with ART—on a flat bottom). The above notwithstanding, the V-shaped bottom profile may not be strictly necessary and e.g. a flat bottom can be used as well, provided that the depth and/or aspect ratio of the trench— and particularly the lower portion thereof—are chosen accordingly (e.g. sufficiently high to achieve the desired low level of defects).

In step g, aspect ratio trapping—as is known to the skilled person—can be used to reduce a number of growth defects (e.g. threading dislocations) in the III-V material. It will be clear that an acceptable number of remaining defects typically depends on the integrity and/or reliability that is sought for the final device. This number also depends on the type of III-V device that is being made, where e.g. an HBT device is typically more sensitive to defects than a HEMT device. Broadly speaking however, the number of threading dislocations in a top portion (e.g. in an active layer) of the III-V material may be lower than $1\times10^9$ defects/cm$^2$, usually lower than $1\times10^6$ defects/cm$^2$.

In embodiments, growing the III-V material in step g may comprise growing a layer stack comprising at least one III-V material (e.g. at least one layer may consist of a III-V material). In embodiments, the layer stack may consist of III-V materials. In embodiments, the layer stack may comprise a buffer layer; such as a buffer layer made of a III-V material (e.g. GaAs, InGaAs or InP). In embodiments, the layer stack may comprise one or more further III-V layers; such as at least one III-V active layer (e.g. an emitter layer). In embodiments, the III-V layer may comprise (e.g. consist of) a material selected from the list of GaAs, InAs, GaSb, InP, InSb, GaP, InGaAs, InAlAs, InGaP, InGaSb, AlGaAs, AlGaP, InAlP, AlGaSb and InAlP. For example, the III-V layers may comprise InGaP emitter layer on a GaAs collector or a InP emitter layer on an InGaAs buffer. The buffer layer advantageously functions to trap growth defects therein and to provide a suitable—relatively—defect-free surface on which to grow the one or more further III-V layers. The above notwithstanding, the III-V material could also consist of a single III-V material, a bottom portion of which could take up to of the buffer layer and a top portion of which could take up the role of the active layer.

In some embodiments, the III-V material grown in the trench step g may be a III-V nano-ridge. In embodiments, the III-V nano-ridge may comprise a lower nano-ridge portion having a first nano-ridge width, an upper nano-ridge portion having a second nano-ridge width, and a middle nano-ridge portion between the upper and lower nano-ridge portions and tapering from the upper to the lower nano-ridge portion. In embodiments, the first nano-ridge width may be from 0.05 to 0.75 times, usually from 0.1 to 0.5 times, the second nano-ridge width. In embodiments, air gaps may be present next to the tapering middle nano-ridge portion (e.g. in the upper trench portion). Methods for forming a III-V nano-ridge form the subject-matter of co-pending U.S. patent application Ser. No. 16/996,146, filed concurrently herewith, and European patent application no. 19195256.3, which are incorporated herein by reference; the III-V nano-ridge may thus for example be formed as described therein. A practical example can be for instance described on p. 13 line 4 p. 14 line 4 in European patent application no. 19195256.3. Note that the 'trench' mentioned in EP application 19195256.3 corresponds to the present 'lower trench portion' and 'out of the trench' corresponds to the present 'upper trench portion'. In embodiments, forming the III-V nano-ridge may comprise initiating growth of the III-V nano-ridge in the lower trench portion, thereby forming a filling layer of the nano-ridge inside the lower trench portion, and continuing growth in the upper trench portion on top of the filling layer, thereby forming the middle nano-ridge portion and upper nano-ridge portion, wherein at least one surfactant may be added in the chamber when the nano-ridge is growing in the upper trench portion. Suitable surfactants are described, for instance, in EP application 19195256.3.

Figure 20:
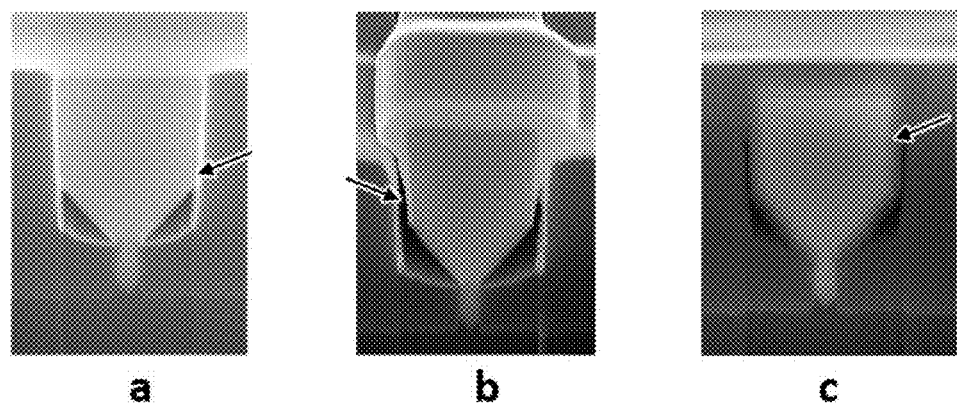
FIG. 20 depicts electron microscope images of semiconductor structures in accordance with the present disclosure. Part a shows the quality of the interface (marked by an arrow) of the III-V material with the dielectric material can be typically relatively bad. Part b shows that the situation can be further aggravated when partially recessing the dielectric material (e.g. a partial wet SiO$_2$ removal); and Part c shows that by partially removing the dielectric next to the III-V material, depositing a passivation layer (marked by an arrow) around the III-V material and subsequently filling up the remaining gap, the interface with the III-V material (i.e. between the III-V material and the passivation layer) can be considerably improved.

In embodiments, after step g the III-V material may be embedded in a dielectric material (e.g. $SiO_2$). In embodiments, the method may comprise a further step g', after step g, of: (g'1) at least partially removing the dielectric material adjacent to (e.g. in contact with) the III-V material; (g'2) coating at least a lateral side (and a optionally a top side) of the III-V material with a passivation layer; and (g'3) re-embedding the III-V material in a dielectric material (e.g. $SiO_2$). In embodiments, step g'3 may comprise refilling an opening formed by step g'1 with the same dielectric material as removed in step g'1 or with a further dielectric material. Step g' could—for example—be performed before or concurrently with step h, but typically before making metal contacts in step i. In embodiments, the passivation layer may be made of a dielectric (e.g. SiN or $Al_2O_3$) or a high-bandgap undoped III-V material (e.g. InGaP or InP). The passivation layer may for instance have a bandgap larger than or equal to an emitter layer—if present—of the III-V device. In embodiments, the passivation layer may have a thickness of from 2 to 20 nm. With reference to FIG. 20, part a, the quality of the interface (marked by an arrow) of the III-V material with the dielectric material can be typically relatively bad. Moreover, FIG. 20, part b, shows that the situation can be further aggravated when partially recessing the dielectric material (e.g. a partial wet $SiO_2$ removal); where due to the weak III-V/dielectric interface, the dielectric etches well past that interface and a gap (marked by an arrow) may be left next to the III-V material. However, by partially removing the dielectric next to the III-V material, depositing a passivation layer (marked by an arrow) around the III-V material and subsequently filling up the remaining gap—the result of which is shown in FIG. 20, part c—the interface with the III-V material (i.e. between the III-V material and the passivation layer) can be considerably improved. The improved interface may for example achieve better recombination, thereby reducing the number of surface defects.

In embodiments, forming the III-V device on the III-V material in step h may comprise etching an emitter for an HBT device in the III-V material. In embodiments, step h may comprise forming at least one contact region to the III-V device for contacting the III-V device to a metal contact (cf. infra).

In embodiments wherein the group IV device was not fully formed in step e, the method may further comprise fully forming the group IV device before step i (e.g. before, during or after step h). This may—for example—comprise performing a replacement metal gate process.

In embodiments, the method may further comprise a step i, after step h, of: (i) forming metal contact to the contact region of the III-V device and the contact region of the group IV device.

In embodiments, any feature of any embodiment of the first aspect may independently be as correspondingly described for any embodiment of any of the other aspects.

In a second aspect, the present disclosure relates to a semiconductor structure comprising: (i) a $Si_xGe_{1-x}(100)$ substrate, where x is from 0 to 1; (ii) a trench isolation on the $Si_xGe_{1-x}(100)$ substrate; (iii) a first region comprising a first section of the $Si_xGe_{1-x}(100)$ substrate, and an at least partially formed group IV device on a $Si_yGe_{1-y}(100)$ surface, where y is from 0 to 1; and (iv) a second region comprising a second section of the $Si_xGe_{1-x}(100)$ substrate, a trench which exposes the $Si_xGe_{1-x}(100)$ substrate and filled with a III-V material, the trench having a depth of at least 200 nm, at least 500 nm, at least 1 µm, or at least 2 µm, with respect to the $Si_yGe_{1-y}(100)$ surface in the first region, and a III-V device on the III-V material, the III-V device comprising at least one contact region at a height within 100 nm, 50 nm, 20 nm, or 10 nm, of a contact region of the group IV device.

Such a semiconductor structure may be obtainable through a method in accordance with the first aspect.

In embodiments, the III-V material may be a III-V nano-ridge. In embodiments, the III-V nano-ridge may comprise a lower nano-ridge portion having a first nano-ridge width, an upper nano-ridge portion having a second nano-ridge width, and a middle nano-ridge portion between the upper and lower nano-ridge portions and tapering from the upper to the lower nano-ridge portion. In embodiments, the first nano-ridge width may be from 0.05 to 0.75 times, usually from 0.1 to 0.5 times, the second nano-ridge width.

In embodiments, the trench having a V-shaped abutment defined by (111)-oriented surfaces of the $Si_xGe_{1-x}(100)$ substrate.

In embodiments, any feature of any embodiment of the second aspect may independently be as correspondingly described for any embodiment of any of the other aspects.

The disclosure will now be described by a detailed description of several embodiments of the disclosure. Other embodiments of the disclosure can be configured according to the knowledge of the person skilled in the art without departing from the true technical teaching of the disclosure, the disclosure being limited only by the terms of the appended claims.

EXAMPLE 1

Approach Based on Group IV Regrowth

Referring to FIG. 1, a Si(100) wafer (10) can be provided, and a first region (21) and second region (22)—each comprising a section of the Si substrate (10)—may be selected for forming therein respectively a group IV device (50) and a III-V device (80). A shallow trench isolation (30) for the III-V device (80) may then formed with a $SiO_2$ dielectric. The shallow trench isolation (30) can also define a Si(100) base (11) in the first region (21) for (re)growing Si thereon.

Figure 2:
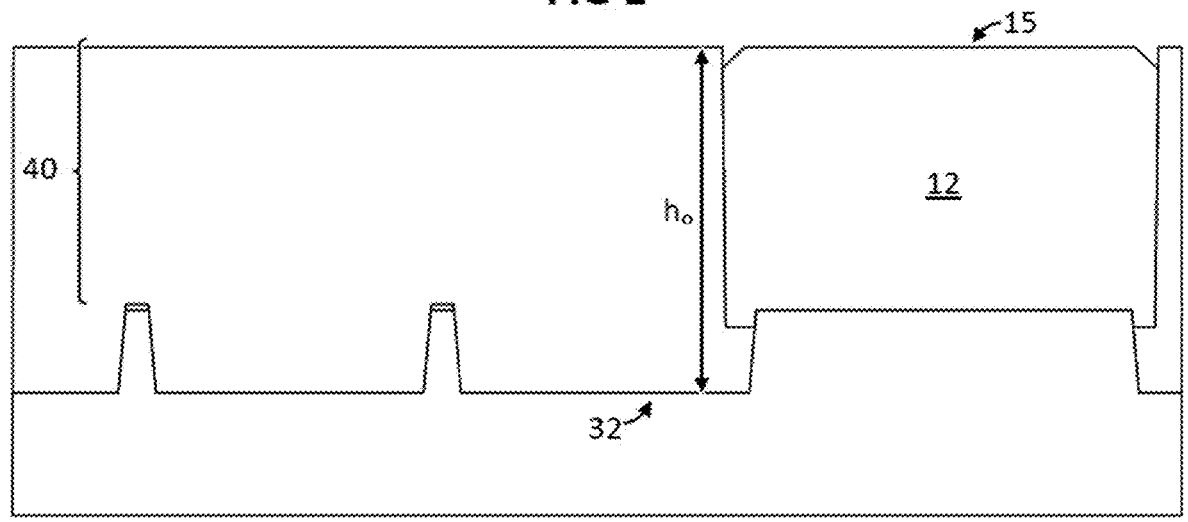
FIG. 2 schematically depicts a semiconductor structure at different stages of a method in accordance with a first exemplary embodiment of the present disclosure. A $SiO_2$ dielectric layer (40) can be deposited over the shallow trench isolation (30) and a window may be opened therein over the Si(100) base (11). Si (12) may then selectively regrown on the Si(100) base (11), thereby providing a Si(100) surface (15) at a height offset ($h_o$) with respect to the bottom (32) of the trench isolation (30) (e.g. an offset of at least 200 nm, at least 500 nm, at least 1 μm, or at least 2 μm, such as 4 μm).

Referring to FIG. 2, a $SiO_2$ dielectric layer (40) can be deposited over the shallow trench isolation (30) and a window may be opened therein over the Si(100) base (11). Si (12) may then selectively regrown on the Si(100) base (11), thereby providing a Si(100) surface (15) at a height offset ($h_o$) with respect to the bottom (32) of the trench isolation (30) (e.g. an offset of at least 200 nm, at least 500 nm, at least 1 µm, or at least 2 µm, such as 4 µm). This height offset ($h_o$) can allow to have the contact regions (53,83) of the final III-V (60) and group IV (50) devices at a similar height (e.g. within 100 nm, 50 nm, 20 nm, or 10 nm from one another); despite the relatively big difference in vertical space typically needed for the III-V device (80), compared to the group IV device (50).

Figure 3:
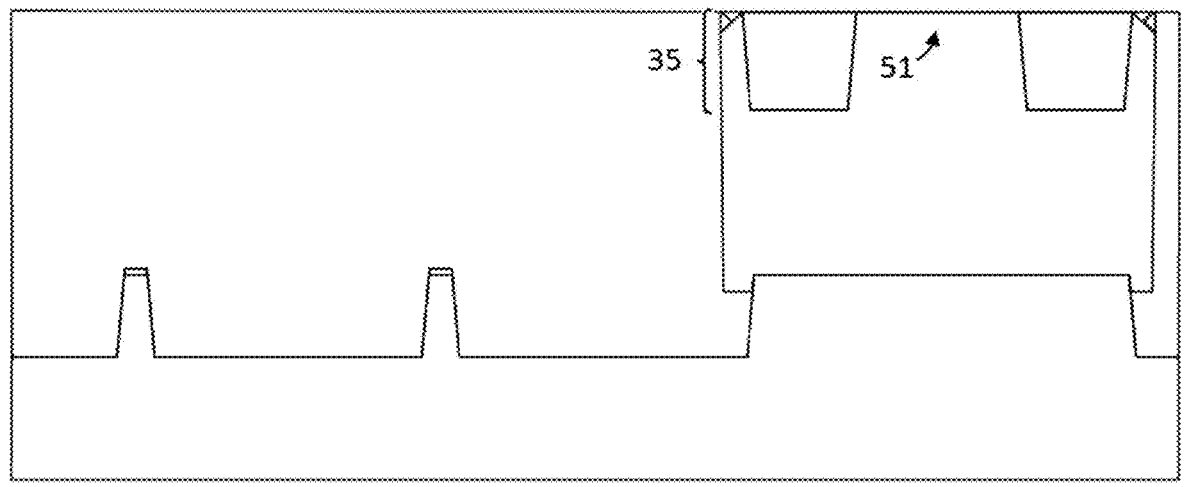
FIG. 3 schematically depicts a semiconductor structure at different stages of a method in accordance with a first exemplary embodiment of the present disclosure. A shallow trench isolation (35) for the group IV device (50) can be formed in the regrown Si (12) with a $SiO_2$ dielectric, to define a group IV active region (51).

Referring to FIG. 3, a shallow trench isolation (35) for the group IV device (50) can be formed in the regrown Si (12) with a $SiO_2$ dielectric, to define a group IV active region (51).

Figure 4:
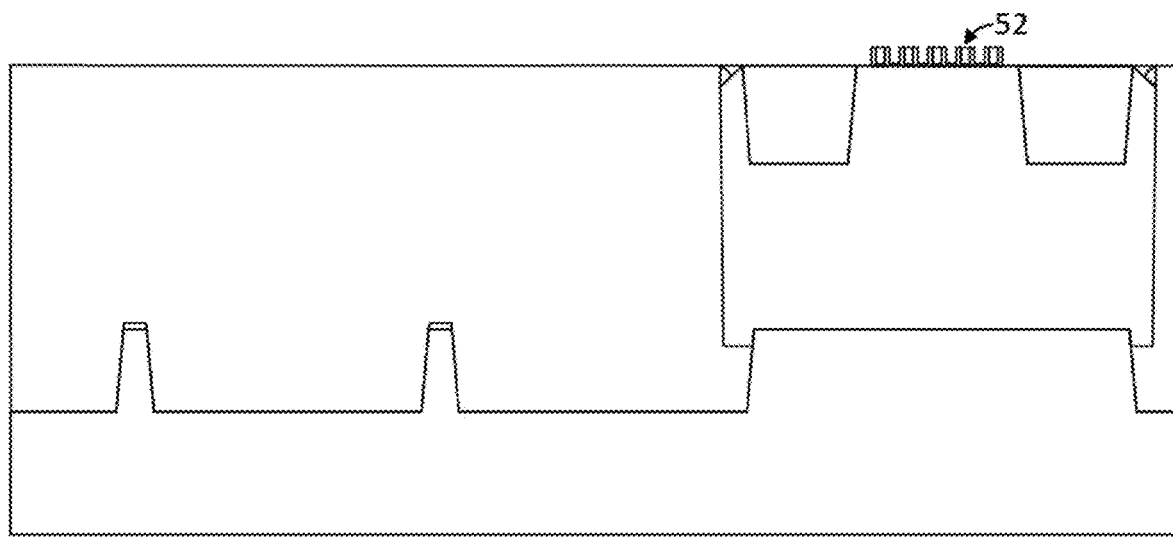
FIG. 4 schematically depicts a semiconductor structure at different stages of a method in accordance with a first exemplary embodiment of the present disclosure. One or more dummy gates (52) may be defined over the active region (51) and these may be flanked with a gate spacer.

Referring to FIG. 4, one or more dummy gates (52) may be defined over the active region (51) and these may be flanked with a gate spacer.

Figure 5:
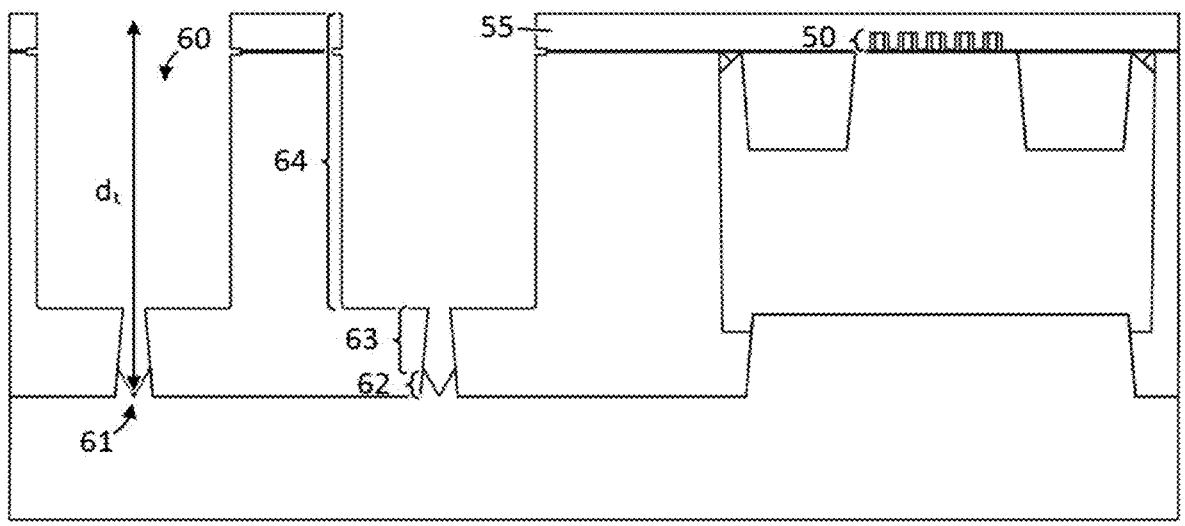
FIG. 5 schematically depicts a semiconductor structure at different stages of a method in accordance with a first exemplary embodiment of the present disclosure. The partially formed group IV device (50) may be covered with a $SiO_2$ zeroth-level interlayer dielectric (ILD0; 55). Next, a trench (60) may be formed in the second region (22) down to and partially into the Si(100) substrate 10).

Referring to FIG. 5, the partially formed group IV device (50) may be covered with a $SiO_2$ zeroth-level interlayer dielectric (ILD0; 55). Next, a trench (60) may be formed in the second region (22) down to and partially into the Si(100) substrate (10). The trench (60) can typically have a depth ($d_t$) such that a bottom (61) thereof may be at the same height as, or somewhat higher than (e.g. between 5 and 50 nm), the bottom (32) of the shallow trench isolation (30) for the III-V device (80). The trench (60) may have a shape suitable for aspect ratio trapping (ART). For example, the trench (60) may have a narrower lower trench portion (63) for ART and a wider upper trench portion (64) for III-V growth confinement. Usually, the lower trench portion (63) may be in contact with a V-shaped abutment (62) defined by (111)-oriented surfaces of the Si(100) substrate (10), which promotes low-defect growth of III-V materials thereon.

Figure 6:
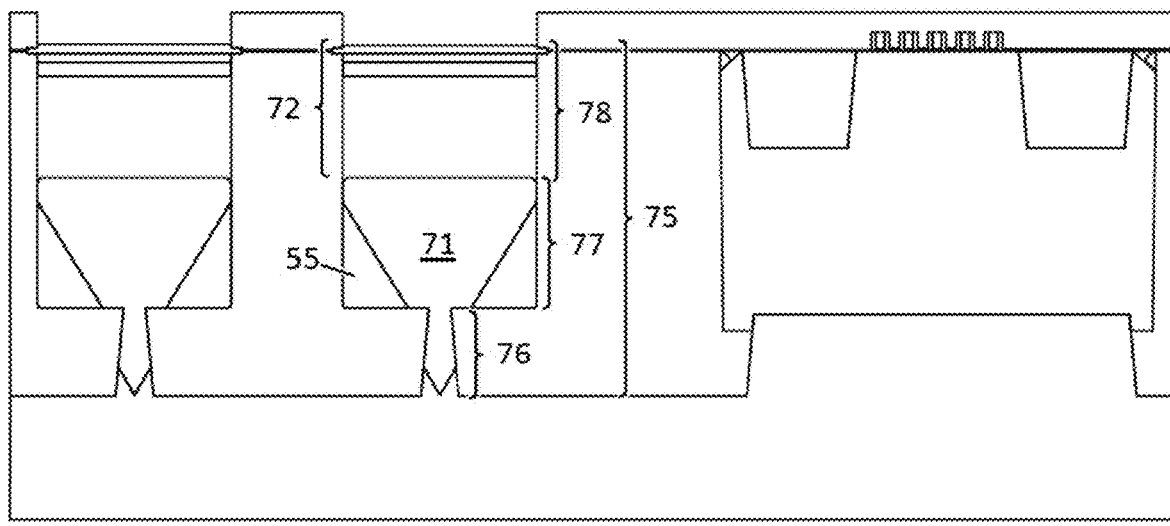
FIG. 6 schematically depicts a semiconductor structure at different stages of a method in accordance with a first exemplary embodiment of the present disclosure. A III-V buffer layer (71) (e.g. GaAs, InP or InGaAs) may be grown in the trench (60) using ART. Subsequently, III-V layers (72) (cf. supra) for the III-V device (80) (e.g. a heterojunction bipolar transistor, HBT) may be grown on the III-V buffer layer (71). The III-V material (71,72) may form a nano-ridge (75) comprising a narrower lower nano-ridge portion (76) in the lower trench portion (63), an wider upper nano-ridge portion (78) in the upper trench portion (64), and a middle nano-ridge portion (77) tapering from the upper to the lower nano-ridge portion (76). Because of the tapering of the middle nano-ridge portion (77), air gaps (78) may be formed at the bottom of the upper trench portion (64).

Referring to FIG. 6, a III-V buffer layer (71) (e.g. GaAs, InP or InGaAs) may be grown in the trench (60) using ART. Subsequently, III-V layers (72) (cf. supra) for the III-V device (80) (e.g. a heterojunction bipolar transistor, HBT) may grown on the III-V buffer layer (71). The III-V material (71,72) may form a nano-ridge (75) comprising a narrower lower nano-ridge portion (76) in the lower trench portion (63), an wider upper nano-ridge portion (78) in the upper trench portion (64), and a middle nano-ridge portion (77) tapering from the upper to the lower nano-ridge portion (76). Because of the tapering of the middle nano-ridge portion (77), air gaps (78) may be formed at the bottom of the upper trench portion (64).

Figure 7:
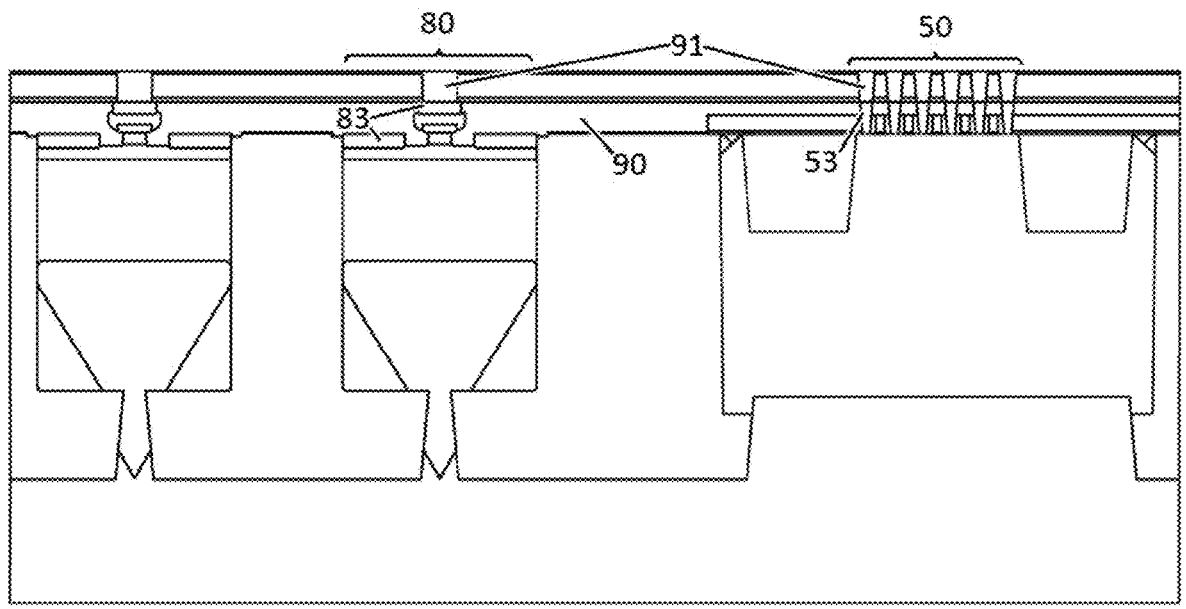
FIG. 7 schematically depicts a semiconductor structure at different stages of a method in accordance with a first exemplary embodiment of the present disclosure. the ILD0 (55) over the dummy gates (52) in the first region (21) can be opened up and a replacement metal gate process if performed thereon, after which the group IV device (50) may be covered with a protective layer, such as a oxide- or nitride-based dielectric material (e.g. $SiO_2$, SiN, SiCN, SiON or $Al_2O_3$). Next, the III-V device (80) may be formed, e.g. by etching an HBT emitter and exposing the HBT base layer and cutting the base layer to expose an HBT subcollector (out of plane from the drawing). Remaining gaps in the second region (22) can then be filled with an oxide- or nitride-based dielectric material (90) (e.g. $SiO_2$) and planarized with respect to the protective layer in the first region (21).

Referring to FIG. 7, the ILD0 (55) over the dummy gates (52) in the first region (21) can be opened up and a replacement metal gate process if performed thereon, after which the group IV device (50) may be covered with a protective layer, such as a oxide- or nitride-based dielectric material (e.g. $SiO_2$, SiN, SiCN, SiON or $Al_2O_3$). Next, the III-V device (80) may be formed, e.g. by etching an HBT emitter and exposing the HBT base layer and cutting the base layer to expose an HBT subcollector (out of plane from the drawing). Remaining gaps in the second region (22) can then be filled with an oxide- or nitride-based dielectric material (90) (e.g. $SiO_2$) and planarized with respect to the protective layer in the first region (21). After which an HBT emitter cap may be optionally formed. As previously indicated, the III-V device (80) and the group IV device (50) can be formed such that contact regions (53,83) for each are formed at a similar height. Finally, the zeroth-level (M0) and first-level (M1) metallization (91) to the contact regions (53,83) of the III-V (80) and group IV (50) devices can be performed.

EXAMPLE 2

Approach Based on Group IV Layer Transfer

Figure 8:
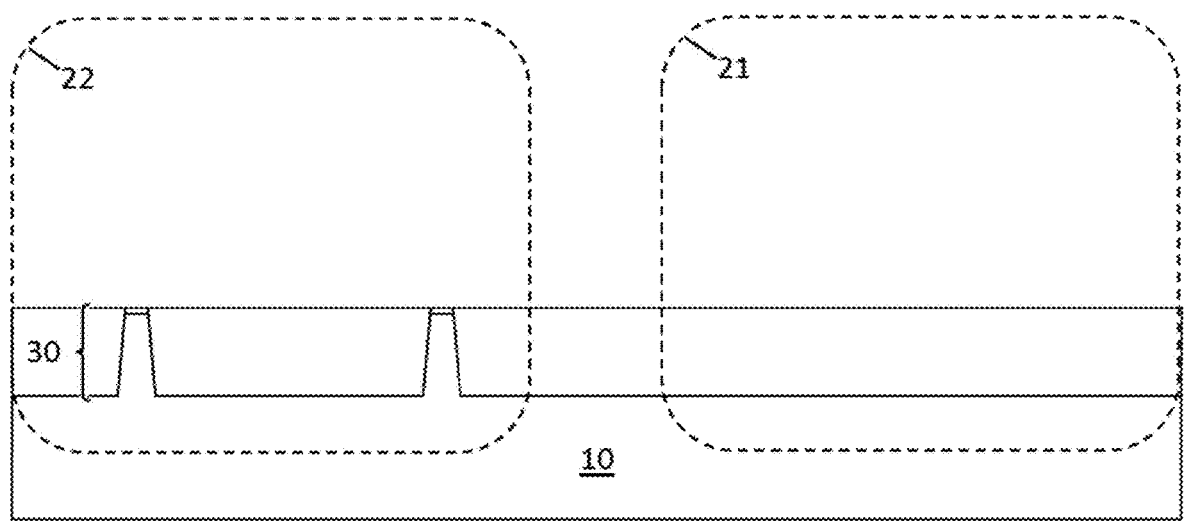
FIG. 8 schematically depicts a semiconductor structure at different stages of a method in accordance with a second exemplary embodiment of the present disclosure. A Si(100) wafer (10) can be provided, and a first region (21) and second region (22) each comprising a section of the Si substrate (10) can be selected for forming therein respectively a group IV device (50) and a III-V device (80). A shallow trench isolation (30) for the III-V device (80) can then be formed with a $SiO_2$ dielectric.

Referring to FIG. 8, a Si(100) wafer (10) can be provided, and a first region (21) and second region (22)—each comprising a section of the Si substrate (10)—can be selected for forming therein respectively a group IV device (50) and a III-V device (80). A shallow trench isolation (30) for the III-V device (80) can then be formed with a $SiO_2$ dielectric.

Figure 9:
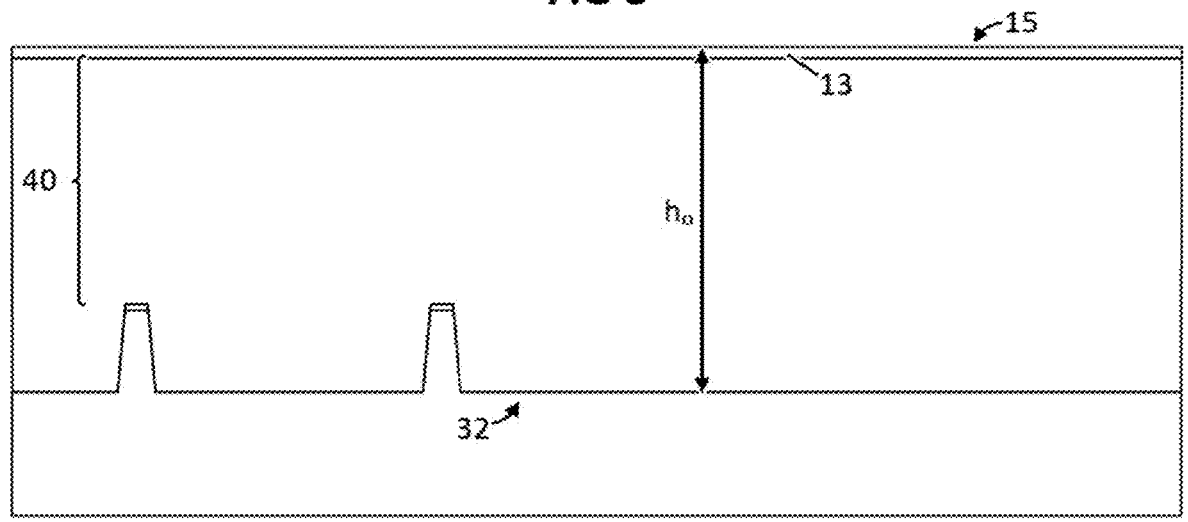
FIG. 9 schematically depicts a semiconductor structure at different stages of a method in accordance with a second exemplary embodiment of the present disclosure. A $SiO_2$ dielectric layer (40) can be deposited over the shallow trench isolation (30) and a Si(100) layer (13) can be layer transferred thereon, thereby providing a Si(100) surface (15) at a height offset ($h_o$) with respect to the bottom (32) of the trench isolation (30) (e.g. an offset of at least 200 nm, at least 500 nm, at least 1 μm, or at least 2 μm, such as 4 μm).

Referring to FIG. 9, a $SiO_2$ dielectric layer (40) can be deposited over the shallow trench isolation (30) and a Si(100) layer (13) can be layer transferred thereon, thereby providing a Si(100) surface (15) at a height offset ($h_o$) with respect to the bottom (32) of the trench isolation (30) (e.g. an offset of at least 200 nm, at least 500 nm, at least 1 µm, or at least 2 µm, such as 4 µm). This height offset ($h_o$) can allow to have the contact regions (53,83) of the final III-V (80) and group IV (50) devices at a similar height (e.g. within 100 nm, 50 nm, or 20 nm, usually 10 nm from one another); despite the relatively big difference in vertical space typically needed for the III-V device (80), compared to the group IV device (50).

Figure 10:
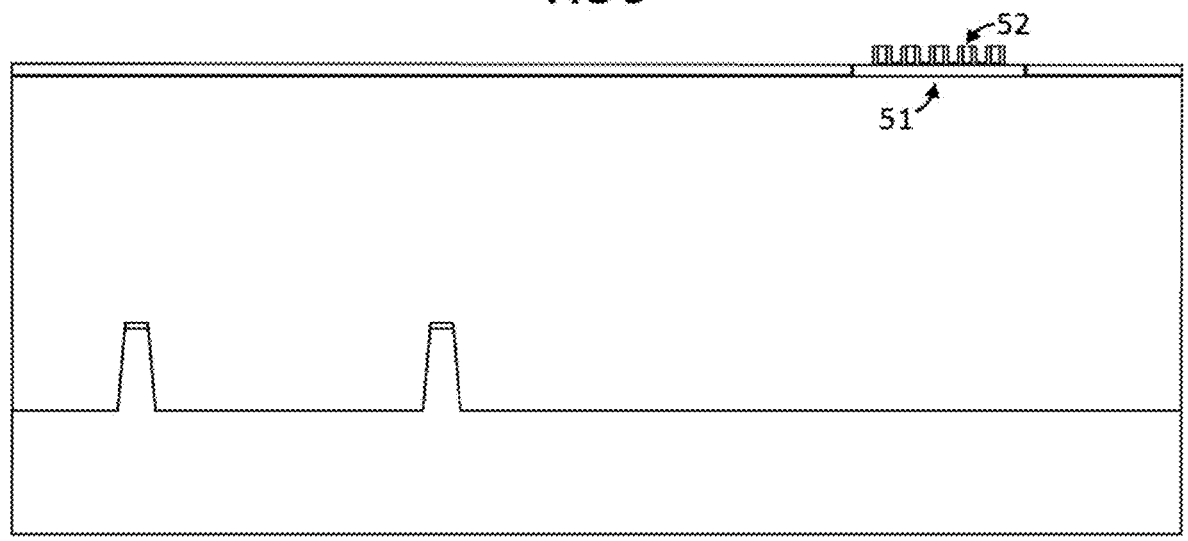
FIG. 10 schematically depicts a semiconductor structure at different stages of a method in accordance with a second exemplary embodiment of the present disclosure. The Si(100) layer can be patterned to delineate a group IV active region (51) and a SiO$_2$ dielectric shallow trench isolation (30)—or a mesa isolation without the need for SiO$_2$ refilling (when the transferred layer is less than 100 nm thick)—for the group IV device (50) can be formed with a. One or more dummy gates (52) can then be defined over the active region (51) and these can be flanked with a gate spacer.

Referring to FIG. 10, the Si(100) layer can be patterned to delineate a group IV active region (51) and a $SiO_2$ dielectric shallow trench isolation (30)—or a mesa isolation without the ned for $SiO_2$ refilling (when the transferred layer is less than 100 nm thick)—for the group IV device (50) can be formed with a. One or more dummy gates (52) can then be defined over the active region (51) and these can be flanked with a gate spacer.

Figure 11:
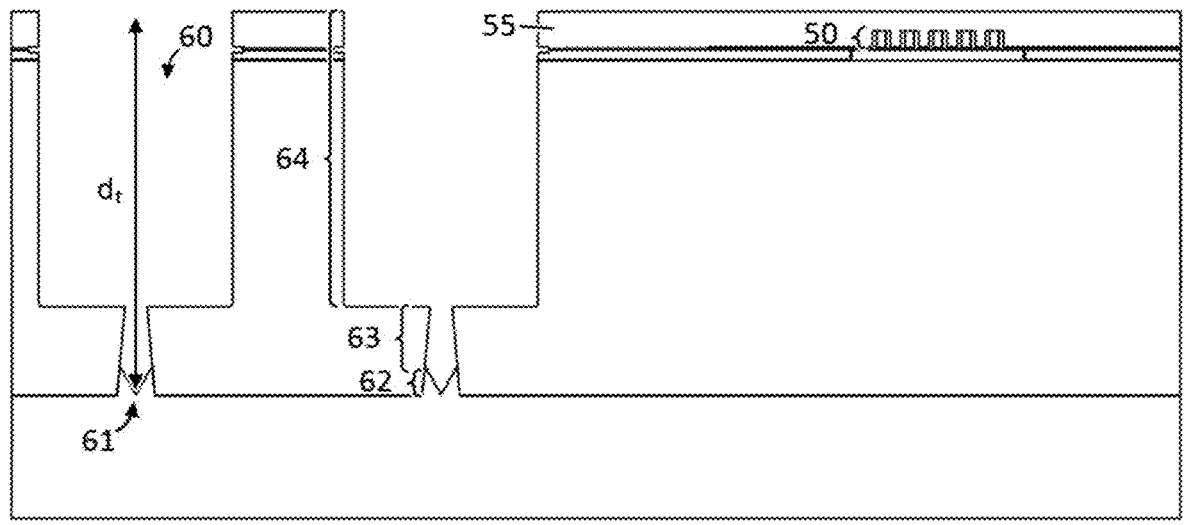
FIG. 11 schematically depicts a semiconductor structure at different stages of a method in accordance with a second exemplary embodiment of the present disclosure. The partially formed group IV device (50) can be covered with a SiO$_2$ zeroth-level interlayer dielectric (ILD0; 55). Next, a trench (60) can be formed in the second region (22) down to and partially into the Si(100) substrate (10). The trench (60) typically has a depth (d$_t$) such that a bottom (61) thereof can be at the same height as, or somewhat higher (e.g. between 5 and 50 nm) than, the bottom (32) of the shallow trench isolation (30) for the III-V device (80).

Referring to FIG. 11, the partially formed group IV device (50) can be covered with a $SiO_2$ zeroth-level interlayer dielectric (ILD0; 55). Next, a trench (60) can be formed in the second region (22) down to and partially into the Si(100) substrate (10). The trench (60) typically has a depth ($d_t$) such that a bottom (61) thereof can be at the same height as, or somewhat higher (e.g. between 5 and 50 nm) than, the bottom (32) of the shallow trench isolation (30) for the III-V device (80). The trench (60) may have a shape suitable for aspect ratio trapping (ART). For example, the trench (60) may have a narrower lower trench portion (63) for ART and a wider upper trench portion (64) for III-V growth confinement. Usually, the lower trench portion (63) can be in contact with a V-shaped abutment (62) defined by (111)-oriented surfaces of the Si(100) substrate (10), which promotes low-defect growth of III-V materials thereon.

Figure 12:
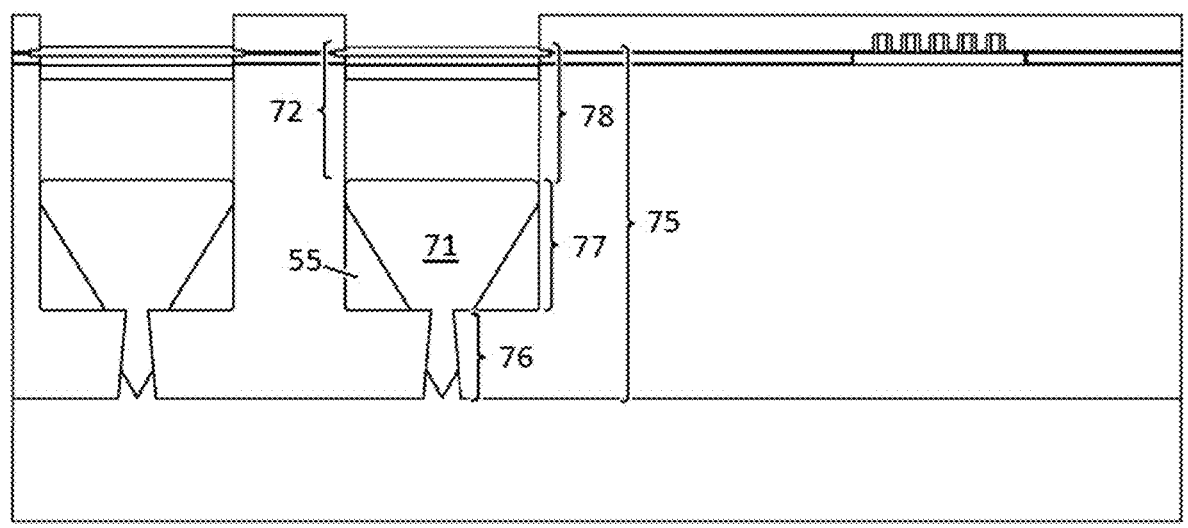
FIG. 12 schematically depicts a semiconductor structure at different stages of a method in accordance with a second exemplary embodiment of the present disclosure. A III-V buffer layer (71) (e.g. GaAs, InP or InGaAs) can be grown in the trench (60) using ART. The buffer forms a nano-ridge (75) comprising a narrower lower nano-ridge portion (76) in the lower trench portion (63), a wider upper nano-ridge portion (78) in the upper trench portion (64), and a middle nano-ridge portion (77) tapering from the upper to the lower nano-ridge portion (76). Because of the tapering of the middle nano-ridge portion (77), air gaps (78) can be formed at the bottom of the upper trench portion (64).

Referring to FIG. 12, a III-V buffer layer (71) (e.g. GaAs, InP or InGaAs) can be grown in the trench (60) using ART. The buffer forms a nano-ridge (75) comprising a narrower lower nano-ridge portion (76) in the lower trench portion (63), a wider upper nano-ridge portion (78) in the upper trench portion (64), and a middle nano-ridge portion (77) tapering from the upper to the lower nano-ridge portion (76). Because of the tapering of the middle nano-ridge portion (77), air gaps (78) can be formed at the bottom of the upper trench portion (64). Subsequently, III-V layers (72) (cf. supra) for the III-V device (80) (e.g. a heterojunction bipolar transistor, HBT) can be grown on the III-V buffer layer (71).

Figure 13:
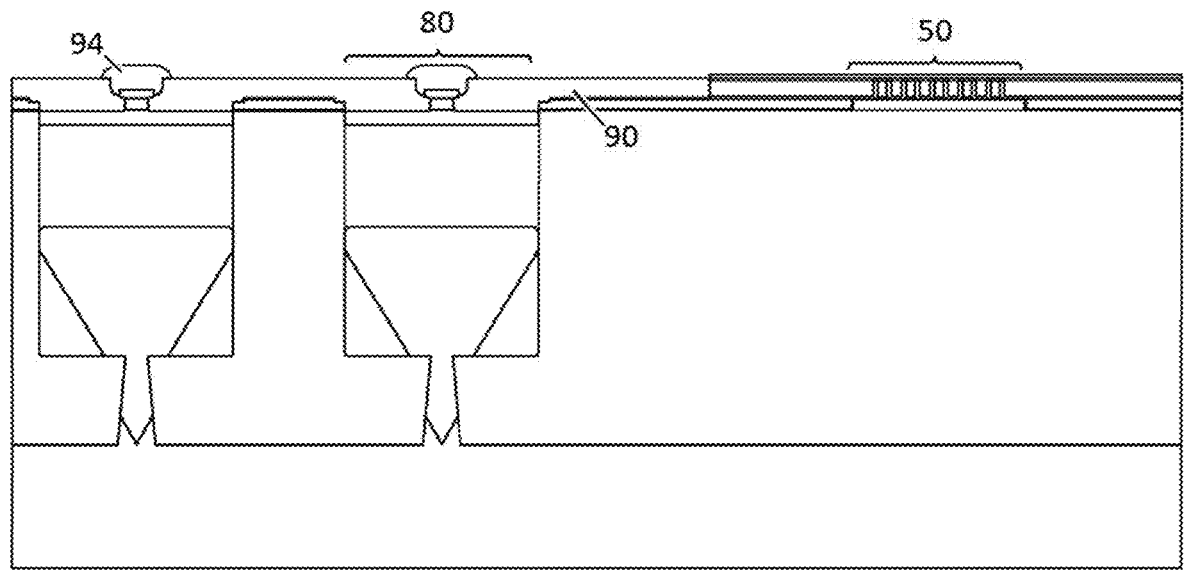
FIG. 13 schematically depicts a semiconductor structure at different stages of a method in accordance with a second exemplary embodiment of the present disclosure. the ILD0 (55) over the dummy gates (52) in the first region (21) may be opened up and a replacement metal gate process if performed thereon, after which the group IV device (50) may be covered with a protective layer, such as a oxide- or nitride-based dielectric material (e.g. SiO$_2$, SiN, SiCN, SiON or Al$_2$O$_3$). Next, the III-V device (80) may be formed, e.g. by etching an HBT emitter and exposing the HBT base layer and cutting the base layer to expose an HBT subcollector (out of plane from the drawing). Remaining gaps in the second region (22) may then filled with an oxide- or nitride-based dielectric material (90) (e.g. SiO$_2$) and planarized with respect to the protective layer in the first region (21).

Referring to FIG. 13, the ILD0 (55) over the dummy gates (52) in the first region (21) may be opened up and a replacement metal gate process if performed thereon, after which the group IV device (50) may be covered with a protective layer, such as a oxide- or nitride-based dielectric material (e.g. $SiO_2$, SiN, SiCN, SiON or $Al_2O_3$). Next, the III-V device (80) may be formed, e.g. by etching an HBT emitter and exposing the HBT base layer and cutting the base layer to expose an HBT subcollector (out of plane from the drawing). Remaining gaps in the second region (22) may then filled with an oxide- or nitride-based dielectric material (90) (e.g. $SiO_2$) and planarized with respect to the protective layer in the first region (21). After which an HBT emitter cap (94) may be optionally formed.

Figure 14:
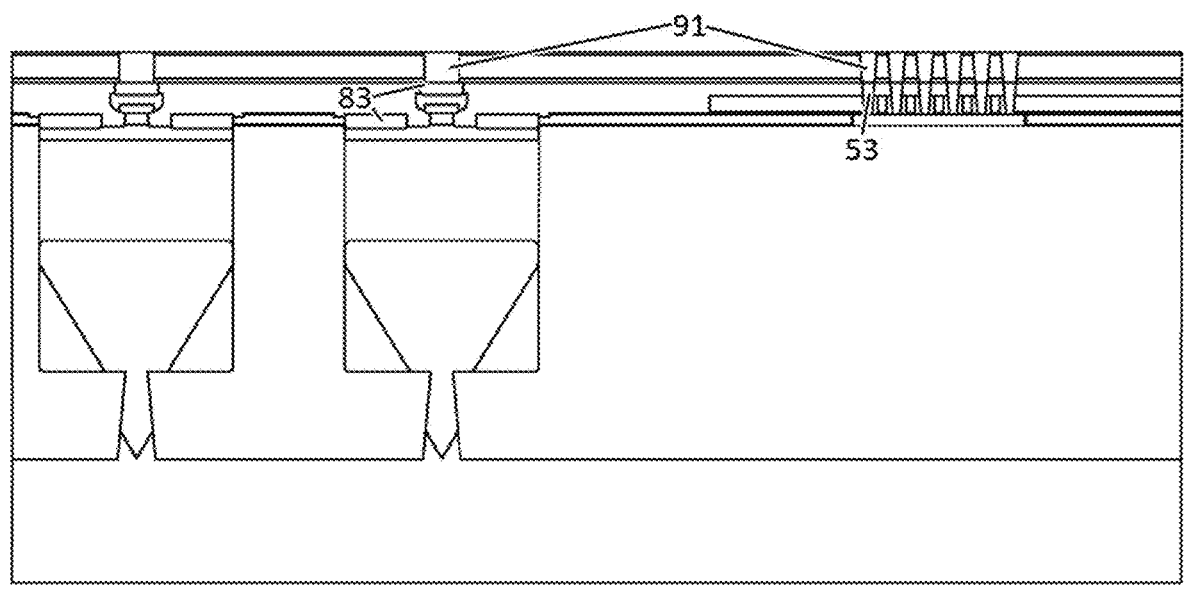
FIG. 14 schematically depicts a semiconductor structure at different stages of a method in accordance with a second exemplary embodiment of the present disclosure. Contact regions (53,83) for the III-V device (80) and the group IV device (50) can be formed. As previously indicated, the III-V device (80) and the group IV device (50) can be formed such that contact regions (53,83) for each can be formed at a similar height. Subsequently, the zeroth-level (M0) and first-level (M1) metallization (91) to the contact regions (53,83) of the III-V (80) and group IV (50) devices may be performed.

Referring to FIG. 14, contact regions (53,83) for the III-V device (80) and the group IV device (50) can be formed. As previously indicated, the III-V device (80) and the group IV device (50) can be formed such that contact regions (53,83) for each can be formed at a similar height. Subsequently, the zeroth-level (M0) and first-level (M1) metallization (91) to the contact regions (53,83) of the III-V (80) and group IV (50) devices may be performed.

EXAMPLE 3

Approach Based on Deep Trench Isolation (30) for the III-V Device (80)

Figure 15:
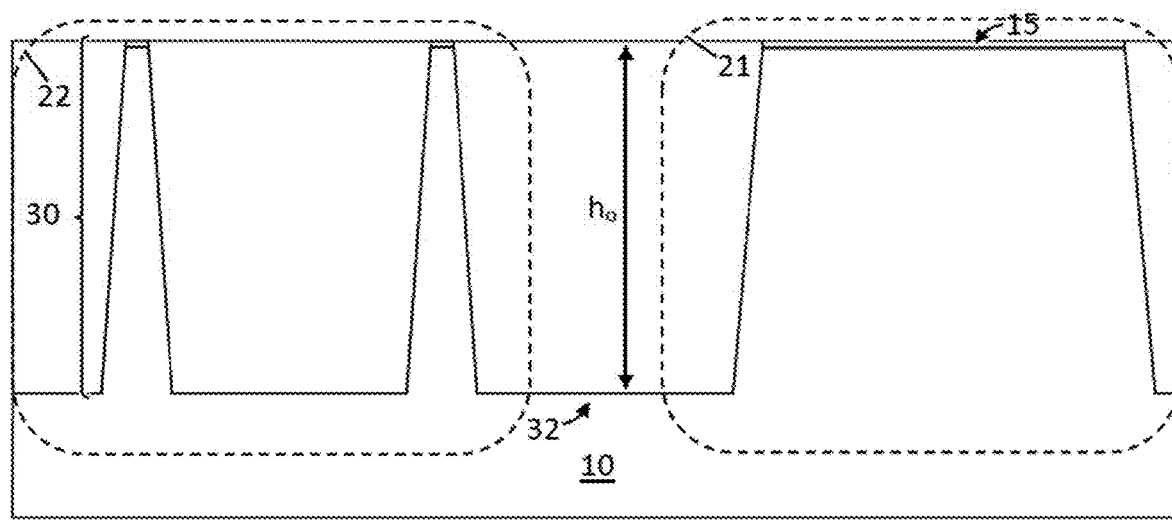
FIG. 15 schematically depicts a semiconductor structure at different stages of a method in accordance with a third exemplary embodiment of the present disclosure. A Si(100) wafer (10) can be provided, and a first region (21) and second region (22)—each comprising a section of the Si substrate (10)—may be selected for forming therein respectively a group IV device (50) and a III-V device (80). A deep trench isolation (30) for the III-V device (80) and the group IV device (50) may then formed with a SiO$_2$ dielectric, thereby providing a Si(100) surface (15) in the first region (21) at a height offset (h$_o$) with respect to the bottom (32) of the trench isolation (30) in the second region (22) (e.g. an offset of at least 200 nm, at least 500 nm, at least 1 µm, or at least 2 µm, such as 4 µm).

Referring to FIG. 15, a Si(100) wafer (10) can be provided, and a first region (21) and second region (22)—each comprising a section of the Si substrate (10)—may be selected for forming therein respectively a group IV device (50) and a III-V device (80). A deep trench isolation (30) for the III-V device (80) and the group IV device (50) may then formed with a SiO₂ dielectric, thereby providing a Si(100) surface (15) in the first region (21) at a height offset ($h_o$) with respect to the bottom (32) of the trench isolation (30) in the second region (22) (e.g. an offset of at least 200 nm, at least 500 nm, at least 1 µm, or at least 2 µm, such as 4 µm). This height offset ($h_o$) can allow to have the contact regions (53,83) of the final III-V (80) and group IV (50) devices at a similar height (e.g. within 100 nm, 50 nm, 20 nm, usually 10 nm from one another); despite the relatively big difference in vertical space typically needed for the III-V device (80), compared to the group IV device (50).

Figure 16:
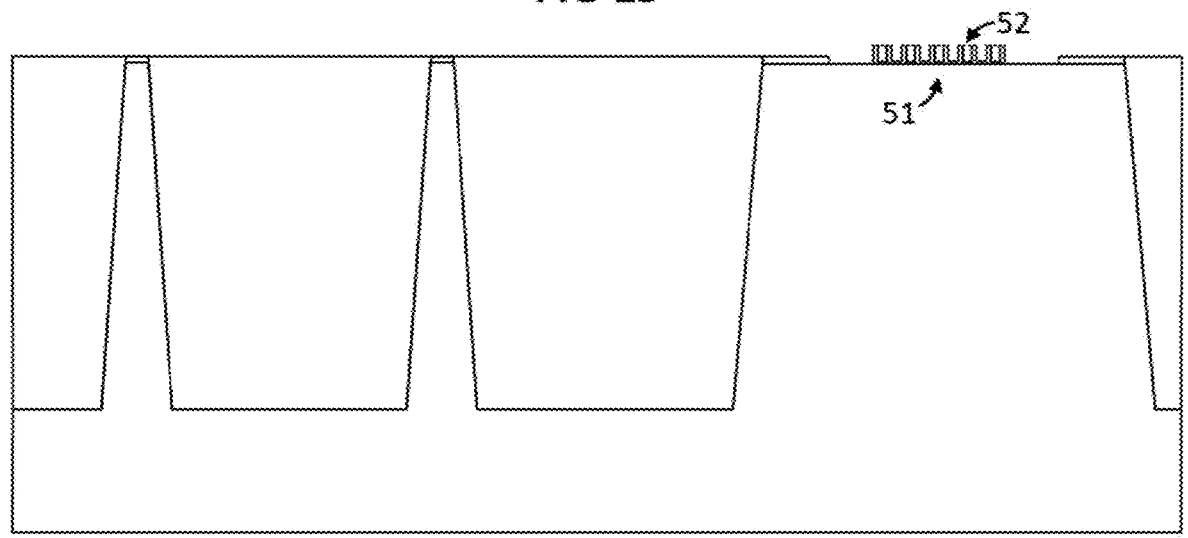
FIG. 16 schematically depicts a semiconductor structure at different stages of a method in accordance with a third exemplary embodiment of the present disclosure. One or more dummy gates (52) can be defined over the active region (51) and these can be flanked with a gate spacer.

Referring to FIG. 16, one or more dummy gates (52) can be defined over the active region (51) and these can be flanked with a gate spacer.

Figure 17:
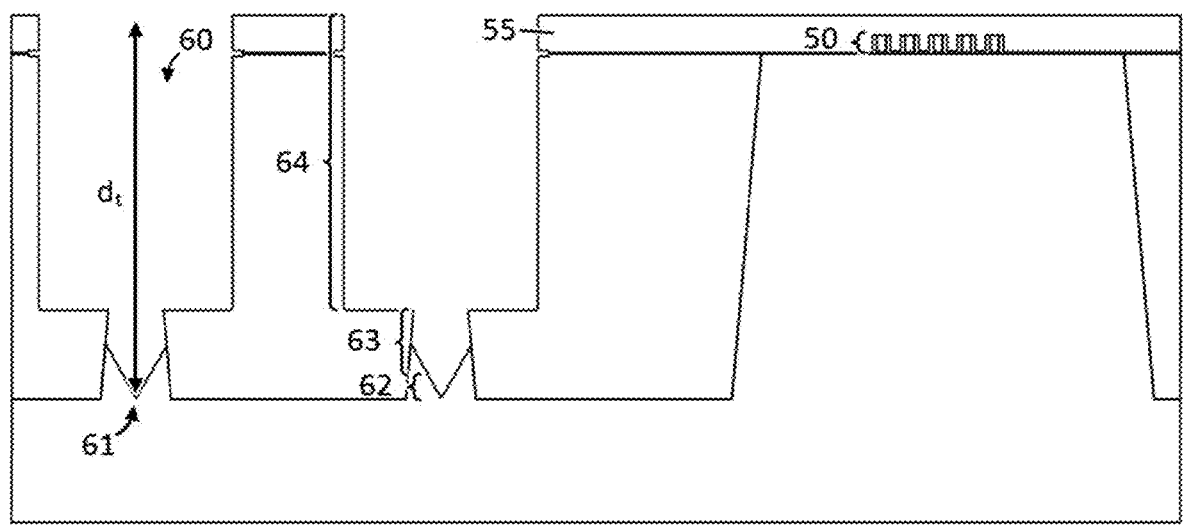
FIG. 17 schematically depicts a semiconductor structure at different stages of a method in accordance with a third exemplary embodiment of the present disclosure. The partially formed group IV device (50) can be covered with a SiO$_2$ zeroth-level interlayer dielectric (ILD0; 55). Next, a trench (60) may be formed in the second region (22) down to and partially into the Si(100) substrate (10). The trench (60) can typically have a depth (d$_t$) such that a bottom (61) thereof may be at the same height as, or somewhat higher (e.g. between 5 and 50 nm) than the bottom (32) of the shallow trench isolation (30) for the III-V device (80).

Referring to FIG. 17, the partially formed group IV device (50) can be covered with a SiO₂ zeroth-level interlayer dielectric (ILD0; 55). Next, a trench (60) may be formed in the second region (22) down to and partially into the Si(100) substrate (10). The trench (60) can typically have a depth ($d_t$) such that a bottom (61) thereof may be at the same height as, or somewhat higher (e.g. between 5 and 50 nm) than the bottom (32) of the shallow trench isolation (30) for the III-V device (80). The trench (60) can have a shape suitable for aspect ratio trapping (ART). For example, the trench (60) may have a narrower lower trench portion (63) for ART and a wider upper trench portion (64) for III-V growth confinement. Usually, the lower trench portion (63) can be in contact with a V-shaped abutment (62) defined by (111)-oriented surfaces of the Si(100) substrate (10), which can promote low-defect growth of III-V materials thereon.

Figure 18:
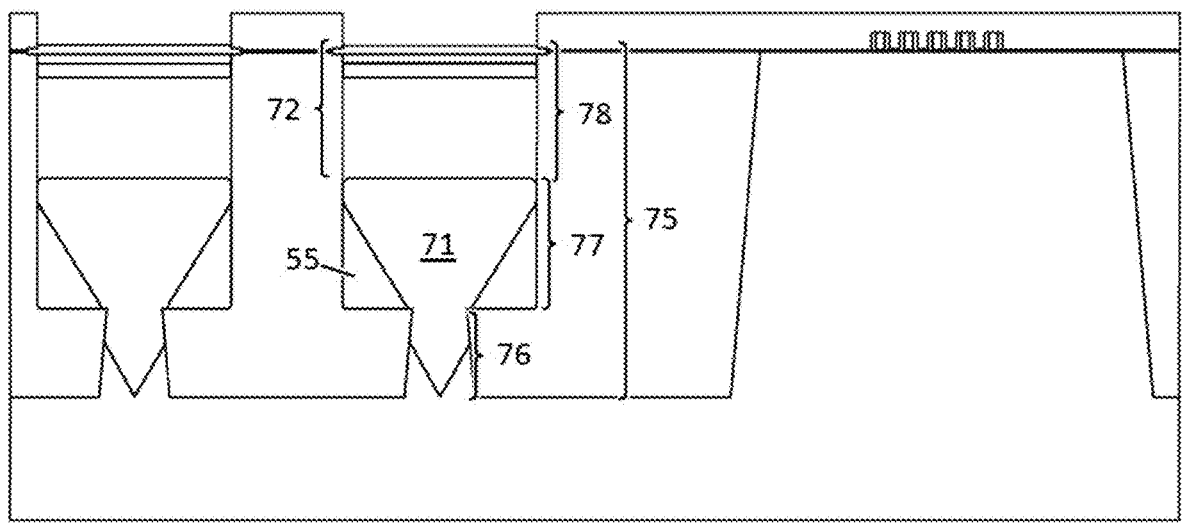
FIG. 18 schematically depicts a semiconductor structure at different stages of a method in accordance with a third exemplary embodiment of the present disclosure. A III-V buffer layer (71) (e.g. GaAs, InP or InGaAs) can be grown in the trench (60) using ART. The buffer may form a nano-ridge (75) comprising a narrower lower nano-ridge portion (76) in the lower trench portion (63), a wider upper nano-ridge portion (78) in the upper trench portion (64), and a middle nano-ridge portion (77) tapering from the upper to the lower nano-ridge portion (76). Because of the tapering of the middle nano-ridge portion (77), air gaps (78) can be formed at the bottom of the upper trench portion (64).

Referring to FIG. 18, a III-V buffer layer (71) (e.g. GaAs, InP or InGaAs) can be grown in the trench (60) using ART. The buffer may form a nano-ridge (75) comprising a narrower lower nano-ridge portion (76) in the lower trench portion (63), a wider upper nano-ridge portion (78) in the upper trench portion (64), and a middle nano-ridge portion (77) tapering from the upper to the lower nano-ridge portion (76). Because of the tapering of the middle nano-ridge portion (77), air gaps (78) can be formed at the bottom of the upper trench portion (64). Subsequently, III-V layers (72) (cf. supra) for the III-V device (80) (e.g. a heterojunction bipolar transistor, HBT) can be grown on the III-V buffer layer (71).

Figure 19:
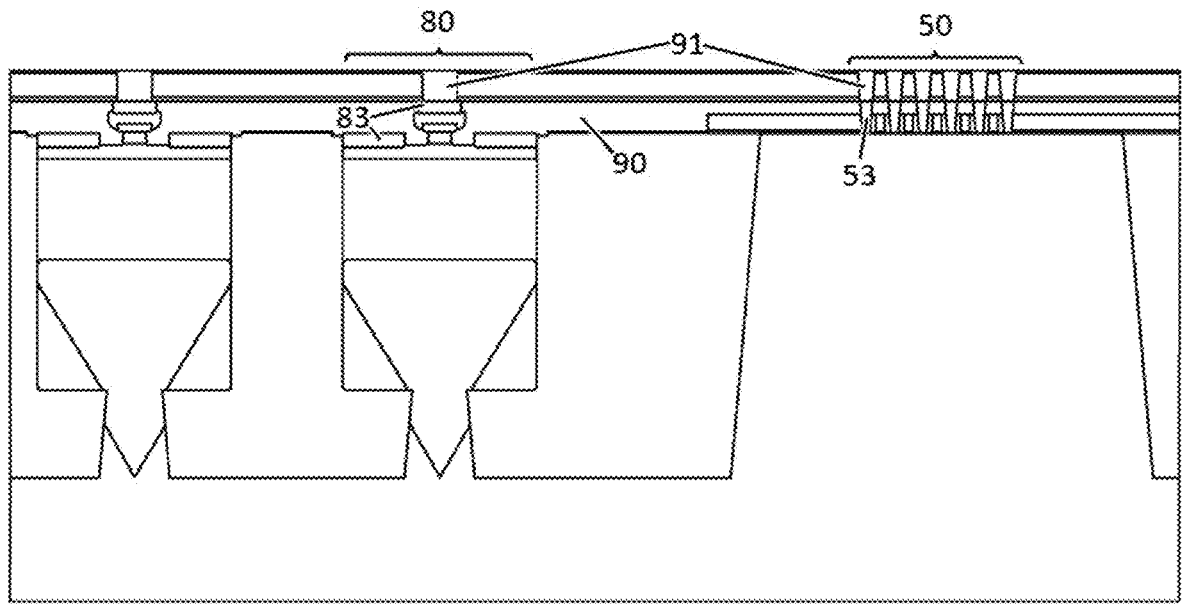
FIG. 19 schematically depicts a semiconductor structure at different stages of a method in accordance with a third exemplary embodiment of the present disclosure. The ILD0 (55) over the dummy gates (52) in the first region (21) can be opened up and a replacement metal gate process if performed thereon, after which the group IV device (50) may be covered with a protective layer, such as a oxide- or nitride-based dielectric material (e.g. SiO$_2$, SiN, SiCN, SiON or Al$_2$O$_3$). Next, the III-V device (80) can be formed, e.g. by etching an HBT emitter and exposing the HBT base layer and cutting the base layer to expose an HBT subcollector (out of plane from the drawing). Remaining gaps in the second region (22) can then be filled with an oxide- or nitride-based dielectric material (90) (e.g. SiO$_2$) and planarized with respect to the protective layer in the first region (21).

Referring to FIG. 19, the ILD0 (55) over the dummy gates (52) in the first region (21) can be opened up and a replacement metal gate process if performed thereon, after which the group IV device (50) may be covered with a protective layer, such as a oxide- or nitride-based dielectric material (e.g. SiO₂, SiN, SiCN, SiON or Al₂O₃). Next, the III-V device (80) can be formed, e.g. by etching an HBT emitter and exposing the HBT base layer and cutting the base layer to expose an HBT subcollector (out of plane from the drawing). Remaining gaps in the second region (22) can then be filled with an oxide- or nitride-based dielectric material (90) (e.g. SiO₂) and planarized with respect to the protective layer in the first region (21). After which an HBT emitter cap can be optionally formed. As previously indicated, the III-V device (80) and the group IV device (50) can be formed such that contact regions (53,83) for each can be formed at a similar height. Finally, the zeroth-level (M0) and first-level (M1) metallization (91) to the contact regions (53,83) of the III-V (80) and group IV (50) devices can be performed.

It is to be understood that although various embodiments, specific constructions and configurations, as well as materials, have been discussed herein for devices according to the present disclosure, various changes or modifications in form and detail may be made without departing from the scope and technical teachings of this disclosure. For example, any formulas given above are merely representative of procedures that may be used. Functionality may be added or deleted from the block diagrams and operations may be interchanged among functional blocks. Steps may be added or deleted to methods described within the scope of the present disclosure.

The invention claimed is:

1. A method comprising:
   a) providing a $Si_xGe_{1-x}$(100) substrate, wherein x ranges from 0 to 1;
   b) selecting a first region for forming therein a group IV device and a second region for forming therein a III-V device, the first and the second region each comprising a section of the $Si_xGe_{1-x}$(100) substrate;
   c) forming a trench isolation in the second region of the $Si_xGe_{1-x}$(100) substrate for at least the III-V device;
   d) after step c, providing a $Si_yGe_{1-y}$(100) surface in the first region of the $Si_xGe_{1-x}$(100) substrate, wherein y ranges from 0 to 1;
   e) after step d but before step f, at least partially forming the group IV device on the $Si_yGe_{1-y}$(100) surface in the first region;
   f) after step e but before step g, forming a trench in the second region of the $Si_xGe_{1-x}$(100) substrate through the trench isolation and partially into the $Si_xGe_{1-x}$(100) substrate which exposes the $Si_xGe_{1-x}$(100) substrate, the trench having a depth of at least 200 nm, at least 500 nm, at least 1 µm, or at least 2 µm, with respect to the $Si_yGe_{1-y}$(100) surface in the first region;
   g) after step f but before step h, growing a III-V material in the trench using aspect ratio trapping; and
   h) after step q, forming the III-V device on the III-V material in the trench, the III-V device comprising at least one contact region at a height within 100 nm, 50 nm, 20 nm, or 10 nm, of a contact region of the group IV device.

2. The method according to claim 1, wherein the trench has a V-shaped abutment defined by (111)-oriented surfaces of the $Si_xGe_{1-x}$(100) substrate.

3. The method according to claim 1, wherein the III-V device is a heterojunction bipolar transistor.

4. The method according to claim 1, wherein the $Si_xGe_{1-x}$(100) substrate is a Si(100) substrate and/or the $Si_yGe_{1-y}$(100) surface is a Si(100) surface.

5. The method according to claim 1, wherein the trench isolation formed in step c has a bottom and wherein step d comprises providing the $Si_yGe_{1-y}$(100) surface in the first region at a height of at least 200 nm, at least 500 nm, at least 1 µm, or at least 2 µm, above the trench isolation bottom.

6. The method according to claim 1, wherein step d comprises depositing a dielectric layer over the $Si_xGe_{1-x}$(100) substrate having a thickness of at least 100 nm, at least 200 nm, at least 500 nm, or at least 1 µm.

7. The method according to claim 1, wherein step d comprises exposing the $Si_xGe_{1-x}$(100) substrate in the first region and growing Si thereon to form the $Si_yGe_{1-y}$(100) surface.

8. The method according to claim 1, wherein step d comprises transferring a Si layer comprising the $Si_yGe_{1-y}$(100) surface onto the $Si_xGe_{1-x}$(100) substrate.

9. The method according to claim 1, wherein the trench isolation provided in step c is a deep trench isolation and wherein the $Si_xGe_{1-x}$(100) substrate as provided in step a comprises the $Si_yGe_{1-y}$(100) surface of step d.

10. The method according to claim 1, wherein the trench of step f comprises a dielectric material and wherein the III-V material of step is embedded in the dielectric material.

11. The method according to claim 10, comprising a further step g', after step g, of:
- g'1) at least partially removing the dielectric material adjacent to the III-V material;
- g'2) coating at least a lateral side of the III-V material with a passivation layer; and
- g'3) re-embedding the III-V material having the passivation layer in a dielectric material that is the same as or different from the dielectric material of step g'1.

12. The method according to claim 1, wherein the trench formed in step f comprises:
- a lower trench portion having a first trench width; and
- an upper trench portion having a second trench width, wherein the first trench width ranges from 0.05 to 0.75 times the second trench width.

13. The method according to claim 12, wherein the first trench width ranges from 0.1 to 0.5 times the second trench width.

14. The method according to claim 1, wherein the III-V material grown in the trench step g is a III-V nano-ridge, the III-V nano-ridge comprising
- a lower nano-ridge portion having a first nano-ridge width;
- an upper nano-ridge portion having a second nano-ridge width; and
- a middle nano-ridge portion between the upper and lower nano-ridge portions and tapering from the upper to the lower nano-ridge portion, wherein the first nano-ridge width ranges from 0.05 to 0.75 times the second nano-ridge width.

15. The method according to claim 14, wherein the first nano-ridge width ranges from 0.1 to 0.5 times the second nano-ridge width.

16. The method according to claim 1, wherein after step c but before step d, depositing a $SiO_2$ dielectric layer on the trench isolation.

17. The method according to claim 1, wherein the III-V device comprising the at least one contact region has the same height of the contact region of the group IV device.

* * * * *